United States Patent
Shizuka

[11] Patent Number: 6,140,659
[45] Date of Patent: Oct. 31, 2000

[54] METHOD AND APPARATUS FOR REMOVING RESIDUAL DIRT ADHERED ON DIES

[75] Inventor: Yoshiaki Shizuka, Fukuoka, Japan

[73] Assignee: NEC Corporation, Tokyo, Japan

[21] Appl. No.: 09/079,454

[22] Filed: May 15, 1998

[30] Foreign Application Priority Data

May 16, 1997 [JP] Japan ................................. 9-126965

[51] Int. Cl.[7] ............................. F21V 7/09; H01L 21/56
[52] U.S. Cl. ................................. 250/504 R; 250/492.1; 134/1
[58] Field of Search ........................... 250/504 R, 492.1; 134/1

[56] References Cited

U.S. PATENT DOCUMENTS

| 5,608,227 | 3/1997 | Dierks et al. | 250/492.1 |
| 5,789,755 | 8/1998 | Bender | 250/492.1 |

FOREIGN PATENT DOCUMENTS

| 60-250915 | 12/1985 | Japan . |
| 61-105117 | 7/1986 | Japan . |
| 63-15710 | 1/1988 | Japan . |
| 5-317821 | 12/1993 | Japan . |
| 8-11185 | 1/1996 | Japan . |
| 8-39030 | 2/1996 | Japan . |
| 9-123206 | 5/1997 | Japan . |

*Primary Examiner*—Jack Berman
*Attorney, Agent, or Firm*—Young & Thompson

[57] ABSTRACT

An apparatus for removing a residual dirt including at least any one of organic and inorganic substances from inner surfaces of dies is used between the dies, wherein the apparatus has an irradiation unit for irradiating a ray mainly includes an ultraviolet ray onto the residual dirt on the surfaces of the dies so that the irradiation of the ray causes a dissociation of atomic bonding or molecular bonding of the organic and inorganic substances of the residual dirt adhered on the inner surfaces of the dies, provided that the ray includes a component having an energy which is higher than the dissociation energies of the organic and inorganic substances.

22 Claims, 8 Drawing Sheets

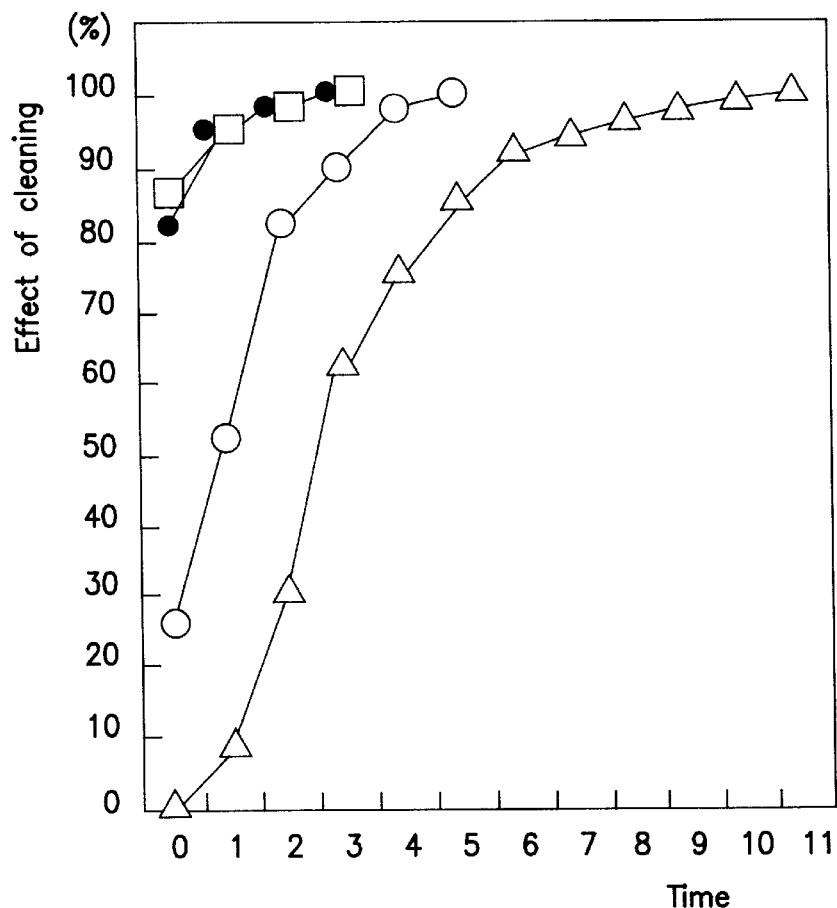

● : level 1 ; the cleaning is carried out by combinations of the ultaviolet ray irradiation, the compressed air blowing, and brushing.

○ : level 2 ; the cleaning is carried out by the ultaviolet ray irradiation only.

□ : level 3 ; the cleaning is carried out by combinations of the ultaviolet ray irradiation and the compressed air blowing.

△ : level 4 ; the cleaning is carried out in the conventional method by use of cleaning resin.

FIG. 5

METHOD AND APPARATUS FOR REMOVING RESIDUAL DIRT ADHERED ON DIES

BACKGROUND OF THE INVENTION

The present invention relates to a method and an apparatus for cleaning dies used for resin-sealing an article, and more particularly to a method and an apparatus for removing organic and inorganic residual substances from dies used for resin-sealing an article such as electronic devices such as electronic devices, for example, semiconductor devices.

The resin-sealing dies are used for resin-sealing semiconductor devices. A resin material used for resin sealing comprises a mixture of various organic and inorganic substances and also includes mold release agent such as wax for facilitating the molded resin product to be released from the dies. If the semiconductor device is sealed with the resin comprising the mixtures of various substances, then a chemical reaction or a polymerization reaction may be caused whereby those substances are deposited on surface of the resin. A part of the deposition on the resin may be adhered on internal surfaces of the dies. As a result, the deposition resides as dirt in hollow portions of internal surfaces of the dies.

Such residual dirty substances becomes accumulated and deposited to increase in size through repeated resin molding operations. The size-increased residual dirty substances changes a shape or a definition of the molded resin product from the predetermined shape or definition defined by the inner shape of the dies. Namely, the size-increased residual dirty substances form deformations or recessed portions in the molded resin product. Even if such the depositions of the residual dirty substances are uniformly adhered on the hollow portions of the dies, then the molded resin product is varied in thickness whereby a problem with a moisture resistance may be raised. To avoid those problems, it is necessary to carry out a periodic cleaning to the dies.

It is, however, important to conduct the required cleaning to the dies without providing substantive mechanical damages to the inner surfaces of the dies. For example, a cleaning solution is first applied on the inner surfaces of the dies for subsequent molding a resin such as a melamine resin having a relatively strong adhesive force with the dirty residual resin so that the deposited dirty residual resin is adhered with the molten resin and removed from the surfaces of the dies. Alternatively, a sheet type synthetic rubber having a strong adhesive force with the dirty residual resin is pressed onto the surfaces of the dies so that the deposited dirty residual resin is adhered with the sheet type synthetic rubber and removed from the surfaces of the dies.

The above conventional cleaning methods require time-consuming and inconvenient operations under high temperature and severe conditions. In order to settle this problem, it had been proposed to use a cleaning device so called as cleaner which is sandwiched between top and bottom dies during the resin molding process. This method is disclosed in Japanese laid-open patent publication No. 6-216175. FIG. 1 is a fragmentary cross sectional elevation view illustrative of a conventional cleaner inserted between top and bottom dies for cleaning the dies. A cleaner 19 is inserted between a top die 20a and a bottom die 20b. The cleaner 19 has top and bottom ozone supplying pipes 18 through which ozone is supplied to the top and bottom dies 20a and 20b to form a highly concentrated ozone atmosphere at about 10000 ppm in internal space of the dies 20a and 20b. The cleaner 19 also has top and bottom ultra-violet ray supplying pipes 17 for irradiating ultraviolet rays onto the ozone atmosphere to form a large amount of oxygen radical so that the dirty organic substances are decomposed by the oxidation and removed from the surfaces of the dies. The cleaner 19 also has top and bottom brushes 21 for cleaning the surfaces oft he top and bottom dies 20a and 20b.

The above conventional cleaning device has the following problems. Indeed, the organic dirty substrates are decomposed by the operations of the oxygen radicals formed by the ultraviolet ray irradiation onto the highly concentrated ozone atmosphere. Notwithstanding, inorganic residual substances could not be decomposed. The oxidation by the oxygen radicals may also remove a mold release agent applied on the surfaces of the top and bottom dies 20a and 20b. If the mold release agent applied on the hollow portion of the dies is removed or peeled by the oxidation, then the molten resin is unlikely to be released from the hollow portion, whereby the molten resin resides at the hollow portion of the dies. Such the residual resin on the hollow portion may cause defamation or form a recessed portion of the molded resin product.

Further, ozone and dusts in the dies may be dispersed to the outside of the dies or the atmosphere. This is harmful to the health of human. On the other hand, ozone in the highly concentrated ozone atmosphere in the dies may partially reside within the dies, whereby the residual ozone causes oxidation of metal of the dies, thereby forming rusts on the die surfaces. As a result, the life-time of the dies is remarkable shortened.

Furthermore, for cleaning the dies with the brushes 21, it is necessary to move the cleaner 19. This makes the mechanism of the cleaning system complicated.

In the above circumstances, it had been required to develop a novel method and an apparatus for cleaning dies free from the above problems.

SUMMARY OF THE INVENTION

Accordingly, it is an object of the present invention to provide a novel apparatus for cleaning dies free from the above problems.

It is a further object of the present invention to provide a novel apparatus for removing organic and inorganic residual substances from surfaces of dies in a short time.

It is a still further object of the present invention to provide a novel apparatus for removing organic and inorganic residual substances from surfaces of dies without operations under high temperature and severe conditions.

It is yet a further object of the present invention to provide a novel apparatus for removing organic and inorganic residual substances from surfaces of dies without dispersion of harmful substances.

It is a further more object of the present invention to provide a novel apparatus for removing organic and inorganic residual substances from surfaces of dies without shortening a life-time of the dies.

It is still more object of the present invention to provide a novel apparatus for removing organic and inorganic residual substances from surfaces of dies with a relatively simple structure of the cleaning system.

It is moreover object of the present invention to provide a novel method for cleaning dies free from the above problems.

It is another object of the present invention to provide a novel method for removing organic and inorganic residual substances from surfaces of dies in a short time.

It is still another object of the present invention to provide a novel method for removing organic and inorganic residual substances from surfaces of dies without operations under high temperature and severe conditions.

It is yet another object of the present invention to provide a novel method for removing organic and inorganic residual substances from surfaces of dies without dispersion of harmful substances.

It is further another object of the present invention to provide a novel method for removing organic and inorganic residual substances from surfaces of dies without shortening a life-time of the dies.

It is an additional object of the present invention to provide a novel method for removing organic and inorganic residual substances from surfaces of dies with a relatively simple structure of the cleaning system.

The above and other objects, features and advantages of the present invention will be apparent from the following descriptions.

The present invention provides an apparatus for removing a residual dirt including at least any one of organic and inorganic substances from inner surfaces of dies. The apparatus is used between the dies. The apparatus has an irradiation unit for irradiating a ray mainly comprising an ultraviolet ray onto the residual dirt on the surfaces of the dies so that the irradiation of the ray causes a dissociation of atomic bonding or molecular bonding of the organic and inorganic substances of the residual dirt adhered on the inner surfaces of the dies, provided that the ray includes a component having an energy which is higher than the dissociation energies of the organic and inorganic substances.

The present invention also provides an apparatus for removing a residual dirt including at least any one of organic and inorganic substances from inner surfaces of dies. The apparatus is used between the dies. The apparatus has an irradiation unit for irradiating a laser beam onto the residual dirt on the surfaces of the dies, provided that the laser beam has a sufficient energy for causing dissociation reactions of the organic and inorganic substances.

BRIEF DESCRIPTION OF THE DRAWINGS

Preferred embodiments according to the present invention will be described in detail with reference to the accompanying drawings.

FIG. 5 is a diagram illustrative of cleaning effects of the conventional and novel cleaning methods over time, wherein mark ● represents the level 1, wherein the cleaning is carried out by combinations of the ultraviolet ray irradiation, the compressed air blowing, and brushing, mark ○ represents the level 2, wherein the cleaning is carried out by the ultraviolet ray irradiation only, mark □ represents the level 3, wherein the cleaning is carried out by combinations of the ultraviolet ray irradiation and the compressed air blowing, and mark Δ represents the level 4, wherein the cleaning is carried out in the conventional method by use of cleaning resin.

DISCLOSURE OF THE INVENTION

Figure 1:
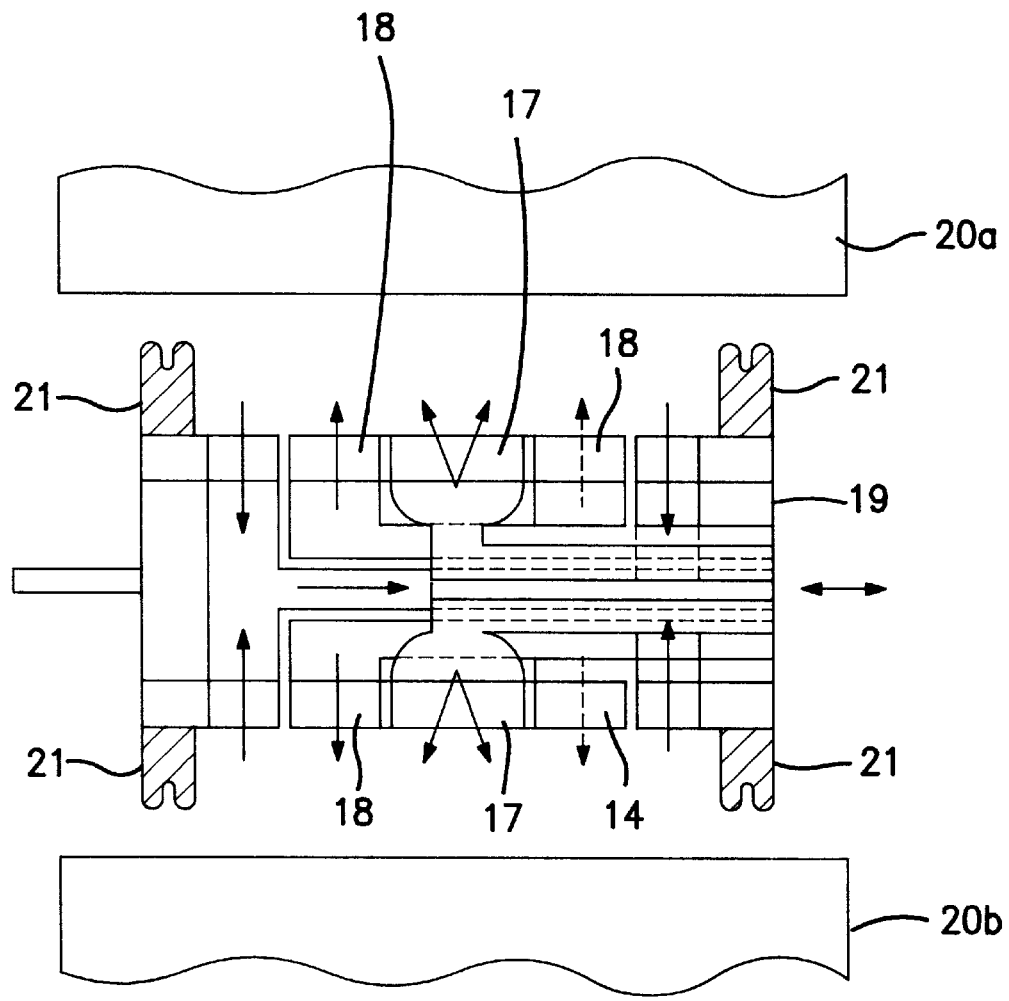
FIG. 1 is a fragmentary cross sectional elevation view illustrative of a conventional cleaner inserted between top and bottom dies for cleaning the dies.

The first present invention provides an apparatus for removing a residual dirt including at least any one of organic and inorganic substances from inner surfaces of dies. The apparatus is used between the dies. The apparatus has an irradiation unit for irradiating a ray mainly comprising an ultraviolet ray onto the residual dirt on the surfaces of the dies so that the irradiation of the ray causes a dissociation of atomic bonding or molecular bonding of the organic and inorganic substances of the residual dirt adhered on the inner surfaces of the dies, provided that the ray includes a component having an energy which is higher than the dissociation energies of the organic and inorganic substances. Namely, the irradiation of the ray causes a decomposition of the organic substance of the residual dirt adhered on the inner surfaces of the dies. It is here considered that the dies are used for molding a resin such as an epoxy resin which is usually used for sealing various semiconductor devices and the residual dirt comprises to epoxy resin. The epoxy resin has a chain structure based on benzene ring and methyl group. Benzene ring and methyl group comprise C=C, C—C, C—H, and C—O bondings. These C=C, C—C, C—H, and C—O bondings have bonding energies which are not higher than 145 kcal. If, for example, the organic substance of the residual dirt having the C—C and C—H bondings receives irradiation of the ultraviolet ray, then C—C and C—H bondings are broken or dissociated to generate —H or hydrogen atoms having dangling bond and —C or carbon atoms having dangling bond so that the hydrogen atoms —H having dangling bond are re-bonded with each other to form $H_2$. These C—C and C—H bondings are broken or dissociated by energies of 95 kcal and 85 kcal respectively which correspond to wavelengths of 254 nanometers and 300 nanometers. Therefore, the irradiation of the ultraviolet rays having the wavelengths of 254 nanometers and 300 nanometers onto the organic substance of the residual dirt having the C—C and C—H bondings causes the dissociation of the C—C and C—H bondings. In those manners, the organic substance of the residual dirt is decomposed by dissociation reactions of the atomic bondings constituting the substances. The decomposed organic substance is easily removed from the inner surfaces of the dies. Further, the irradiation of the ultraviolet ray onto the organic and inorganic substances of the residual dirt does heat up the organic and inorganic substances of the residual dirt whereby the decomposition of the organic substance is promoted by the heating. If, for example, the ray includes long wavelength components of 365 nanometers and 540 nanometers, then thermal decompositions of the organic and inorganic substances may be caused.

It is preferable that the ray comprises ultraviolet rays having wavelengths of not shorter than 200 nm to avoid generation of ozone. If the ray includes a shorter wavelength composition than 200 nanometers, then it may be possible to provide a cut-off filter for cutting off the shorter wavelength composition than 200 nanometers of the ultraviolet ray. In this case, it is preferable that the irradiation unit for irradiating the ray comprises: an ultraviolet ray lamp emitting the ultraviolet ray; a set of concave mirrors being positioned around the ultraviolet ray lamp for reflecting the ultraviolet ray having been emitted from the ultraviolet ray lump; and a pair of reflective mirrors being positioned around the ultraviolet ray lamp for reflecting the ultraviolet ray having been reflected from the concave mirrors toward the dies.

It is also preferable to further provide at least a blower for blowing a gas onto the residual dirt on the inner surfaces of the dies. In this case, it is preferable that the blower for blowing the gas comprises a pair of top and bottom air blowers for blowing air onto the inner surfaces of the dies respectively. In this case, it is further preferable that the top and bottom air blowers are accommodated in subordinate rooms connected to the dies and separated from a main room accommodating the irradiation unit for irradiating the ray. In this case, it is furthermore preferable that the main room is isolated by ray-transparent plates from the subordinate rooms so that the ray transmits through the ray-transparent plates onto the residual dirt on the inner surfaces of the dies.

It is also preferable that the gas is a compressed air.

It is also preferable to further provide at least a top brush for brushing the inner surface of the top die and at least a bottom brush for brushing the inner surface oft he bottom die. In this case, it is preferable that the top and bottom brushes comprise roller brushes which are movable in directions parallel surfaces of the dies so that the roller brushes reach entire of the inner surfaces of the dies.

The above novel apparatus is capable of removing the organic and inorganic residual substances from inner surfaces of the dies in a short time without operations under high temperature and severe conditions.

The above novel apparatus is also capable of removing the organic and inorganic residual substances from inner surfaces of the dies without dispersion of harmful substances such as ozone.

The above novel apparatus is also capable of removing the organic and inorganic residual substances from inner surfaces of the dies without shortening a life-time of the dies.

The second present invention provides an apparatus for removing a residual dirt including at least any one of organic and inorganic substances from inner surfaces of dies. The apparatus is used between the dies. The apparatus has an irradiation unit for irradiating a laser beam onto the residual dirt on the surfaces of the dies, provided that the laser beam has a sufficient energy for causing dissociation reactions of the organic and inorganic substances. Namely, the irradiation of the laser beam causes a decomposition of the organic substance of the residual dirt adhered on the inner surfaces of the dies. It is here considered that the dies are used for molding a resin such as an epoxy resin which is usually used for sealing various semiconductor devices and the residual dirt comprises the epoxy resin. The epoxy resin has a chain structure based on benzene ring and methyl group. Benzene ring and methyl group comprise C=C, C—C, C—H, and C—O bondings. These C=C, C—C, C—H, and C—O bondings have bonding energies which are not higher than 145 kcal. If, for example, the organic substance of the residual dirt having the C—C and C—H bondings receives irradiation of the laser beam having a higher energy than dissociation energy of the C—C and C—H bondings, then the C—C and C—H bondings are broken or dissociated to generate —H or hydrogen atoms having dangling bond and —C or carbon atoms having dangling bond so that the hydrogen atoms —H having dangling bond are re-bonded with each other to form $H_2$. Therefore, the irradiation of the laser beam having a high coherency onto the organic substance of the residual dirt having the C—C and C—H bondings causes the dissociation of the C—C and C—H bondings. In those manners, the organic substance of the residual dirt is decomposed by dissociation reactions of the atomic bondings constituting the substances. The decomposed organic substances are easily removed from the inner surfaces of the dies. Further, the irradiation of the laser beam onto the organic and inorganic substances of the residual dirt does heat up the organic and inorganic substances of the residual dirt whereby the decompositions of the organic substances are promoted by the heating.

It is preferable that the irradiation unit for irradiating the laser beam comprises: at least a laser device emitting the laser beam; and at least a reflective mirror for reflecting the laser beam having been emitted from the laser device toward the inner surfaces of the dies, the reflective mirror being capable of changing in direction of a mirror face thereof so that a transmission direction of the laser beam reflected is changed between toward the inner surfaces of the dies, and also the reflective mirror being movable in directions parallel to surfaces of the dies so that the laser beams are scanned onto entire of the inner surfaces of the dies.

It is also preferable to further provide at least a blower for blowing a gas onto the residual dirt on the inner surfaces of the dies. In this case, it is further preferable that the blower for blowing the gas comprises a pair of top and bottom air blowers for blowing air onto the inner surfaces of the dies respectively. In this case, it is furthermore preferable that the top and bottom air blowers are accommodated in subordinate rooms connected to the dies and separated from a main room accommodating the irradiation unit for irradiating the laser beam. In this case, it is still further preferable that the main room is isolated by ray-transparent plates from the subordinate rooms so that the laser beam transmits through the ray-transparent plates onto the residual dirt on the inner surfaces of the dies.

It is also preferable that the gas is a compressed air.

It is also preferable to further provide at least a top brush for brushing the inner surface of the top die and at least a bottom brush for brushing the inner surface of the bottom die. In this case, it is further preferable that the top and bottom brushes comprise roller brushes which are movable in directions parallel surfaces of the dies so that the roller brushes reach entire of the inner surfaces of the dies.

The above novel apparatus is capable of removing the organic and inorganic residual substances from inner surfaces of the dies in a short time without operations under high temperature and severe conditions.

The above novel apparatus is also capable of removing the organic and inorganic residual substances from inner surfaces of the dies without dispersion of harmful substances such as ozone.

The above novel apparatus is also capable of removing the organic and inorganic residual substances from inner surfaces of the dies without shortening a life-time of the dies.

The third present invention provides a cleaner being used between dies for cleaning inner surfaces of the dies, wherein the cleaner has an irradiation unit for irradiating a ray mainly comprising an ultraviolet ray onto the residual dirt on the inner surfaces of the dies so as to decompose a residual dirt including at least an organic substance adhered on the inner surfaces of the dies for facilitation of a subsequent removal of the residual dirt from the inner surfaces of the dies, provided that the ray includes a component having an energy which is higher than the dissociation energies of the organic and inorganic substances. Namely, the irradiation of the ray causes a decomposition of the organic substance of the residual dirt adhered on the inner surfaces of the dies. It is here considered that the dies are used for molding a resin such as an epoxy resin which is usually used for sealing various semiconductor devices and the residual dirt comprises the epoxy resin. The epoxy resin has a chain structure based on benzene ring and methyl group. Benzene ring and methyl group comprise C=C, C—C, C—H, and C—O bondings. These C=C, C—C, C—H, and C—O bondings have bonding energies which are not higher than 145 kcal. If, for example, the organic substance of the residual dirt having the C—C and C—H bondings receives irradiation of the ultraviolet ray, then C—C and C—H bondings are broken or dissociated to generate —H or hydrogen atoms having dangling bond and —C or carbon atoms having dangling bond so that the hydrogen atoms —H having dangling bond are re-bonded with each other to form $H_2$. These C—C and C—H bondings are broken or dissociated by energies of 95 kcal and 85 kcal respectively which correspond to wavelengths of 254 nanometers and 300 nanometers. Therefore, the irradiation of the ultraviolet rays having the wavelengths of 254 nanometers and 300 nanometers onto the organic substance of the residual dirt having the C—C and C—H bondings causes the dissociation of the C—C and C—H bondings. In those manners, the organic substances of the residual dirt are decomposed by dissociation reactions of the atomic bondings constituting the substances. The decomposed organic substances are easily removed from the inner surfaces of the dies. Further, the irradiation of the ultraviolet ray onto the organic and inorganic substances of the residual dirt does heat up the organic and inorganic substances of the residual dirt whereby the decompositions of the organic and inorganic substances are promoted by the heating. If, for example, the ray includes long wavelength components of 365 nanometers and 540 nanometers, then thermal decompositions of the organic and inorganic substances may be caused.

It is preferable that the ray comprises ultraviolet rays having wavelengths of not shorter than 200 nm to avoid generation of ozone. If the ray includes a shorter wavelength composition than 200 nanometers, then it may be possible to provide a cut-off filter for cutting off the shorter wavelength composition than 200 nanometers of the ultraviolet ray. In this case, it is preferable that the irradiation unit for irradiating the ray comprises: an ultraviolet ray lamp emitting the ultraviolet ray; a set of concave mirrors being positioned around the ultraviolet ray lamp for reflecting the ultraviolet ray having been emitted from the ultraviolet ray lamp; and a pair of reflective mirrors being positioned around the ultraviolet ray lump for reflecting the ultraviolet ray having been reflected from the concave mirrors toward the dies.

It is also preferable to further provide at least a blower for blowing a gas onto the residual dirt on the inner surfaces of the dies. In this case, it is further preferable that the irradiation unit for blowing the gas comprises a pair of top and bottom air blowers for blowing air onto the inner surfaces of the dies respectively. In this case, it is furthermore preferable that the top and bottom air blowers are accommodated in subordinate rooms connected to the dies and separated from a main room accommodating the irradiation unit for irradiating the ray. In this case, it is moreover preferable that the main room is isolated by ray-transparent plates from the subordinate rooms so that the ray transmits through the ray-transparent plates onto the residual dirt on the inner surfaces of the dies.

It is also preferable that the gas is a compressed air.

It is also preferable to further provide at least a top brush for brushing the inner surface of the top die and at least a bottom brush for brushing the inner surface oft he bottom die. In this case, it is further preferable that the top and bottom brushes comprise roller brushes which are movable in directions parallel surfaces of the dies so that the roller brushes reach entire of the inner surfaces of the dies.

The above novel cleaner is capable or removing the organic and inorganic residual substances from inner surfaces of the dies in a short time without operations under high temperature and severe conditions.

The above novel cleaner is also capable of removing the organic and inorganic residual substances from inner surfaces of the dies without dispersion of harmful substances such as ozone.

The above novel cleaner is also capable of removing the organic and inorganic residual substances from inner surfaces of the dies without shortening a life-time of the dies.

The fourth present invention provides a cleaner being used between dies for cleaning inner surfaces of the dies, wherein the cleaner has an irradiation unit for irradiating a laser beam onto the residual dirt on the inner surfaces of the dies so as to decompose a residual dirt including at least an organic substance adhered on the inner surfaces of the dies for facilitation of a subsequent removal of the residual dirt from the inner surfaces of the dies, provided that the laser beam has a sufficient energy for causing dissociation reactions of the organic and inorganic substances. Namely, the irradiation of the laser beam causes a decomposition of the organic substance of the residual dirt adhered on the inner surfaces of the dies. It is here considered that the dies are used for molding a resin such as an epoxy resin which is usually used for sealing various semiconductor devices and the residual dirt comprises the epoxy resin. The epoxy resin has a chain structure based on benzene ring and methyl group. Benzene ring and methyl group comprise C=C, C—C, C—H, and C—O bondings. These C=C, C—C, C—H, and C—O bondings have bonding energies which are not higher than 145 kcal. If, for example, the organic substance of the residual dirt having the C—C and C—H bondings receives irradiation of the laser beam having a higher energy than dissociation energy of the C—C and C—H bondings, then the C—C and C—H bondings are broken or dissociated to generate —H or hydrogen atoms having dangling bond and —C or carbon atoms having dangling bond so that the hydrogen atoms —H having dangling bond are re-bonded with each other to form $H_2$. Therefore, the irradiation of the laser beam having a high coherency onto the organic substance of the residual dirt having the C—C and C—H bondings causes the dissociation of the C—C and C—H bondings. In those manners, the organic substances of the residual dirt are decomposed by dissociation reactions of the atomic bondings constituting the substances. The decomposed organic substances are easily removed from the inner surfaces of the dies. Further, the irradiation of the laser beam onto the organic and inorganic substances of the residual dirt does heat up the organic and inorganic substances of the residual dirt whereby the decompositions of the organic and inorganic substances are promoted by the heating.

It is preferable that the irradiation unit for irradiating the laser beam comprises: at least a laser device emitting the laser beam; and at least a reflective mirror for reflecting the laser beam having been emitted from the laser device toward the inner surfaces of the dies, the reflective mirror being capable of changing in direction of a mirror face thereof so that a transmission direction of the laser beam reflected is changed between toward the inner surfaces of the dies, and also the reflective mirror being movable in directions parallel to surfaces of the dies so that the laser beams are scanned onto entire of the inner surfaces of the dies.

It is also preferable to further provide at least a blower for blowing a gas onto the residual dirt on the inner surfaces of the dies. In this case, it is further preferable that the blower for blowing the gas comprises a pair of top and bottom air blowers for blowing air onto the inner surfaces of the dies respectively. In this case, it is furthermore preferable that the top and bottom air blowers are accommodated in subordinate rooms connected to the dies and separated from a main room accommodating the irradiation unit for irradiating the laser beam. In this case, it is moreover preferable that the main room is isolated by ray-transparent plates from the subordinate rooms so that the laser beam transmits through the ray-transparent plates onto the residual dirt on the inner surfaces of the dies.

It is also preferable that the gas is a compressed air.

It is also preferable to further provide at least a top brush for brushing the inner surface of the top die and at least a bottom brush for brushing the inner surface of the bottom die. In this case, it is further preferable that the top and bottom brushes comprise roller brushes which are movable in directions parallel surfaces of the dies so that the roller brushes reach entire of the inner surfaces of the dies.

The above novel cleaner is capable of removing the organic and inorganic residual substances from inner surfaces of the dies in a short time without operations under high temperature and severe conditions.

The above novel cleaner is also capable of removing the organic and inorganic residual substances from inner surfaces of the dies without dispersion of harmful substances such as ozone.

The above novel cleaner is also capable of removing the organic and inorganic residual substances from inner surfaces of the dies without shortening a life-time of the dies.

The fifth present invention provides a method of decomposing a residual dirt including at least an organic substance adhered on inner surfaces of dies for facilitating a subsequent removal of the residual dirt from the inner surfaces of the dies. The method comprises the step of irradiating a ray mainly comprising an ultraviolet ray onto the residual dirt on the surfaces of the dies, provided that the ray includes a component having an energy which is higher than the dissociation energies of the organic and inorganic substances. Namely, the irradiation of the ray causes a decomposition of the organic substance of the residual dirt adhered on the inner surfaces of the dies. It is here considered that the dies are used for molding a resin such as an epoxy resin which is usually used for sealing various semiconductor devices and the residual dirt comprises the epoxy resin. The epoxy resin has a chain structure based on benzene ring and methyl group. Benzene ring and methyl group comprise C=C, C—C, C—H, and C—O bondings. These C=C, C—C, C—H, and C—O bondings have bonding energies which are not higher than 145 kcal. If, for example, the organic substance of the residual dirt having the C—C and C—H bondings receives irradiation of the ultraviolet ray, then C—C and C—H bondings are broken or dissociated to generate —H or hydrogen atoms having dangling bond and —C or carbon atoms having dangling bond so that the hydrogen atoms —H having dangling bond are re-bonded with each other to form $H_2$. These C—C and C—H bondings are broken or dissociated by energies of 95 kcal and 85 kcal respectively which correspond to wavelengths of 254 nanometers and 300 nanometers. Therefore, the irradiation of the ultraviolet rays having the wavelengths of 254 nanometers and 300 nanometers onto the organic substance of the residual dirt having the C—C and C—H bondings causes the dissociation of the C—C and C—H bondings. In those manners, the organic substances of the residual dirt are decomposed by dissociation reactions of the atomic bondings constituting the substances. The decomposed organic substances are easily removed from the inner surfaces of the dies. Further, the irradiation of the ultraviolet ray onto the organic and inorganic substances of the residual dirt does heat up the organic and inorganic substances of the residual dirt whereby the decompositions of the organic and inorganic substances are promoted by the heating. If, for example, the ray includes long wavelength components of 365 nanometers and 540 nanometers, then thermal decompositions of the organic and inorganic substances may be caused.

It is preferable that the ray comprises ultraviolet rays having wavelengths of not shorter than 200 nm to avoid generation of ozone. If the ray includes a shorter wavelength composition than 200 nanometers, then it may be possible to provide a cut-off filter for cutting off the shorter wavelength composition than 200 nanometers of the ultraviolet ray.

The above novel method is capable of removing the organic and inorganic residual substances from inner surfaces of the dies in a short time without operations under high temperature and severe conditions.

The above novel method is also capable of removing the organic and inorganic residual substances from inner surfaces of the dies without dispersion of harmful substances such as ozone.

The above novel method is also capable of removing the organic and inorganic residual substances from inner surfaces of the dies without shortening a life-time of the dies.

The sixth present invention provides a method of removing a residual dirt including at least any one of organic and inorganic substances from inner surfaces of dies. The method comprises the step of: irradiating a ray mainly comprising an ultraviolet ray onto the residual dirt on the surfaces of the dies; and blowing a gas onto the residual dirt on the inner surfaces of the dies, provided that the ray includes a component having an energy which is higher than the dissociation energies of the organic and inorganic substances. Namely, the irradiation of the ray causes a decomposition of the organic substance of the residual dirt adhered on the inner surfaces of the dies. It is here considered that the dies are used for molding a resin such as an epoxy resin which is usually used for sealing various semiconductor devices and the residual dirt comprises the epoxy resin. The epoxy resin has a chain structure based on benzene ring and methyl group. Benzene ring and methyl group comprise C=C, C—C, C—H, and C—O bondings. These C=C, C—C, C—H, and C—O bondings have bonding energies which are not higher than 145 kcal. If, for example, the organic substance of the residual dirt having the C—C and C—H bondings receives irradiation of the ultraviolet ray, then C—C and C—H bondings are broken or dissociated to generate —H or hydrogen atoms having dangling bond and —C or carbon atoms having dangling bond so that the hydrogen atoms —H having dangling bond are re-bonded with each other to form $H_2$. These C—C and C—H bondings are broken or dissociated by energies of 95 kcal and 85 kcal respectively which correspond to wavelengths of 254 nanometers and 300 nanometers. Therefore, the irradiation of the ultraviolet rays having the wavelengths of 254 nanometers and 300 nanometers onto the organic substance of the residual dirt having the C—C and C—H bondings causes the dissociation of the C—C and C—H bondings. In those manners, the organic substances of the residual dirt are decomposed by dissociation reactions of the atomic bondings constituting the substances. The decomposed organic substances are easily removed from the inner surfaces of the dies. Further, the irradiation of the ultraviolet ray onto the organic and inorganic substances of the residual dirt does heat up the organic and inorganic substances of the residual dirt whereby the decompositions of the organic and inorganic substances are promoted by the heating. If, for example, the ray includes long wavelength components of 365 nanometers and 540 nanometers, then thermal decompositions of the organic and inorganic substances may be caused.

It is preferable that the ray comprises ultraviolet rays having wavelengths of not shorter than 200 nm to avoid generation of ozone. If the ray includes a shorter wavelength composition than 200 nanometers, then it may be possible to provide a cut-off filter for cutting off the shorter wavelength composition than 200 nanometers of the ultraviolet ray.

It is also preferable that the gas is blown by a pair of top and bottom air blowers onto the inner surfaces of the dies respectively. In this case, it is also preferable that the gas is a compressed air.

It is also preferable to further comprise the step of brushing with brushes the inner surface of the top die after the gas has been blown. In this case, it is also preferable that the brushes comprise roller brushes which are movable in directions parallel surfaces of the dies so that the roller brushes reach entire of the inner surfaces of the dies.

The above novel method is capable of removing the organic and inorganic residual substances from inner surfaces of the dies in a short time without operations under high temperature and severe conditions.

The above novel method is also capable of removing the organic and inorganic residual substances from inner surfaces of the dies without dispersion of harmful substances such as ozone.

The above novel method is also capable of removing the organic and inorganic residual substances from inner surfaces of the dies without shortening a life-time of the dies.

The seventh present invention provides a method of decomposing a residual dirt including at least an organic substance adhered on inner surfaces of dies for facilitating a subsequent removal of the residual dirt from the inner surfaces of the dies. The method comprises the step of irradiating a laser beam onto the residual dirt on the surfaces of the dies, provided that the laser beam has a sufficient energy for causing dissociation reactions of the organic and inorganic substances. Namely, the irradiation of the laser beam causes a decomposition of the organic substance of the residual dirt adhered on the inner surfaces of the dies. It is here considered that the dies are used for molding a resin such as an epoxy resin which is usually used for sealing various semiconductor devices and the residual dirt comprises the epoxy resin. The epoxy resin has a chain structure based on benzene ring and methyl group. Benzene ring and methyl group comprise C=C, C—C, C—H, and C—O bondings. These C=C, C—C, C—H, and C—O bondings have bonding energies which are not higher than 145 kcal. If, for example, the organic substances of the residual dirt having the C—C and C—H bondings receives irradiation of the laser beam having a higher energy than dissociation energy of the C—C and C—H bondings, then the C—C and C—H bondings are broken or dissociated to generate —H or hydrogen atoms having dangling bond and —C or carbon atoms having dangling bond so that the hydrogen atoms —H having dangling bond are re-bonded with each other to form $H_2$. Therefore, the irradiation of the laser beam having a high coherency onto the organic substance of the residual dirt having the C—C and C—H bondings causes the dissociation of the C—C and C—H bondings. In those manners, the organic substances of the residual dirt and decomposed by dissociation reactions of the atomic bondings constituting the substances. The decomposed organic substances are easily removed from the inner surfaces of the dies. Further, the irradiation of the laser beam onto the organic and inorganic substances of the residual dirt does heat up the organic and inorganic substances of the residual dirt whereby the decompositions of the organic and inorganic substances are promoted by the heating.

The above novel method is capable of removing the organic and inorganic residual substances from inner surfaces of the dies in a short time without operations under high temperature and severe conditions.

The above novel method is also capable of removing the organic and inorganic residual substances from inner surfaces of the dies without dispersion of harmful substances such as ozone.

The above novel method is also capable of removing the organic and inorganic residual substances from inner surfaces of the dies without shortening a life-time of the dies.

The eighth present invention provides a method of removing a residual dirt including at least any one of organic and inorganic substances from inner surfaces of die. The method comprises the step of: irradiating a laser beam onto the residual dirt on the surfaces of the dies; and blowing a gas onto the residual dirt on the inner surfaces of the dies, provided that the laser beam has a sufficient energy for causing dissociation reactions of the organic and inorganic substances. Namely, the irradiation of the laser beam causes a decomposition of the organic substance of the residual dirt adhered on the inner surfaces of the dies. It is here considered that the dies are used for molding a resin such as an epoxy resin which is usually used for sealing various semiconductor devices and the residual dirt comprises the epoxy resin. The epoxy resin has a chain structure based on benzene ring and methyl group. Benzene ring and methyl group comprise C=C, C—C, C—H, and C—O bondings. These C=C, C—C, C—H, and C—O bondings have bonding energies which are not higher than 145 kcal. If, for example, the organic substances of the residual dirt having the C—C and C—H bondings receives irradiation of the laser beam having a higher energy than dissociation energy of the C—C and C—H bondings, then the C—C and C—H bondings are broken or dissociated to generate —H or hydrogen atoms having dangling bond and —C or carbon atoms having dangling bond so that the hydrogen atoms —H having dangling bond are re-bonded with each other to form $H_2$. Therefore, the irradiation of the laser beam having a high coherency onto the organic substance of the residual dirt having the C—C and C—H bondings causes the dissociation of the C—C and C—H bondings. In those manners, the organic substances of the residual dirt are decomposed by dissociation reactions of the atomic bondings constituting the substances. The decomposed organic substances are easily removed from the inner surfaces of the dies. Further, the irradiation of the laser beam onto the organic and inorganic substances of the residual dirt does heat up the organic and inorganic substances of the residual dirt whereby the decompositions of the organic and inorganic substances are promoted by the heating.

It is also preferable that the gas is blown by a pair of top and bottom air blowers onto the inner surfaces of the dies respectively.

It is also preferable that the gas is a compressed air.

It is also preferable to further comprise the step of brushing with brushes the inner surface of the top die after the gas has been blown. In this case, it is further preferable that the brushes comprise roller brushes which are movable in directions parallel surfaces of the dies so that the roller brushes reach entire of the inner surface of the dies.

The above novel method is capable of removing the organic and inorganic residual substances from inner surfaces of the dies in a short time without operations under high temperature and severe conditions.

The above novel method is also capable of removing the organic and inorganic residual substances from inner surfaces of the dies without dispersion of harmful substances such as ozone.

The above novel method is also capable of removing the organic and inorganic residual substances from inner surfaces of the dies without shortening a life-time of the dies.

PREFERRED EMBODIMENTS

First Embodiment

Figure 2A:
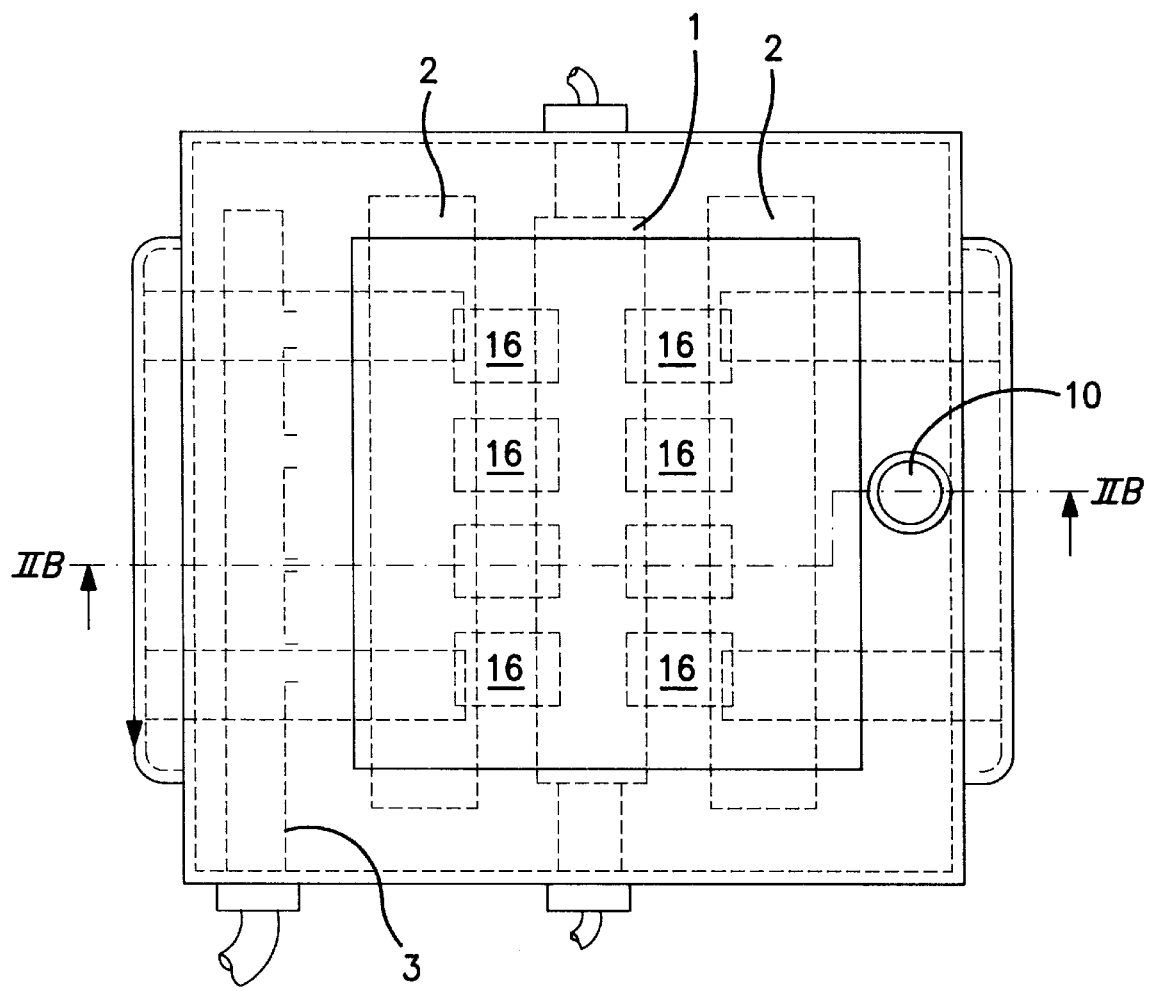
FIG. 2A is a plane view illustrative of a novel cleaner for removing a residual dirt including at least any one of organic and inorganic substances from inner surfaces of dies in a first embodiment in accordance with the present invention.
Figure 2B:
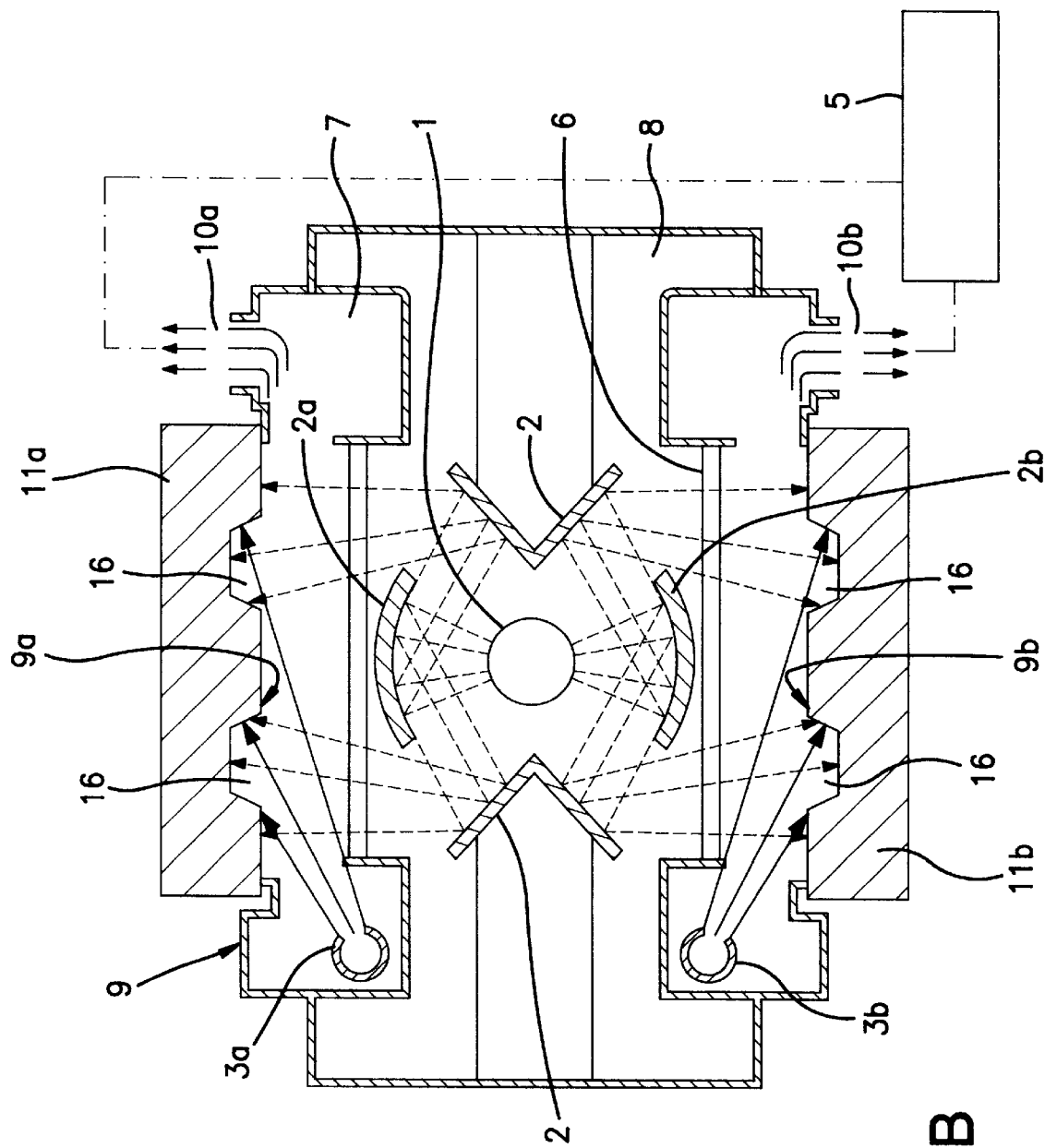
FIG. 2B is a cross sectional elevation view illustrative of a novel cleaner for removing a residual dirt including at least any one of organic and inorganic substances from inner surfaces of dies taken along an IIB—IIB line of FIG. 2A.

A first embodiment according to the present invention will be described in detail with reference to FIGS. 2A and 2B, wherein there is provided a novel cleaner for removing a residual dirt including at least any one of organic and inorganic substances from inner surfaces of dies which is used for resin-molding. FIG. 2A is a plane view illustrative of a novel cleaner for removing a residual dirt including at least any one of organic and inorganic substances from inner surfaces of dies. FIG. 2B is a cross sectional elevation view illustrative of a novel cleaner for removing a residual dirt including at least any one of organic and inorganic substances from inner surfaces of dies taken along an IIB—IIB line of FIG. 2A. The novel cleaner is positioned in use between top and bottom die $11a$ and $11b$ which are distanced in a vertical direction from each other. Each of the top and bottom dies $11a$ and $11b$ has an inner surface having plural hollow portions 16. The cleaner comprises a casing 9 which has top and bottom walls which further have top and bottom openings $9a$ and $9b$, wherein the top and bottom openings $9a$ and $9b$ are adjacent to inner surfaces of the top and bottom dies $11a$ and $11b$. The top and bottom openings $9a$ and $9b$ are tightly in contact with the surfaces of the top and bottom dies $11a$ and $11b$ so that the casing 9 of the cleaner and the inner surfaces of the dies $11a$ and $11b$ do form an air-tightly closing inner space. The casing 9 comprises a light-irradiation chamber 8 and top and bottom cleaning chambers 7 provided on the top and bottom of the light-irradiation chamber 8. A top surface of the top cleaning chamber 7 has the top opening $9a$ bounded with the inner surface of the top die $11a$. A bottom surface of the top cleaning chamber 7 has a top light-transparent window 6 which isolates the top cleaning chamber 7 from the light-irradiation chamber 8. The top light-transparent window 6 may comprise a glass plate allowing transmission of a short wavelength ultraviolet ray. The glass plate may preferable comprise a soda-lime glass plate or a quartz glass plate. A bottom surface of the bottom cleaning chamber 7 has the bottom opening $9b$ bounded with the inner surface of the bottom die 11. A top surface of the bottom cleaning chamber 7 has a bottom light-transparent window 6 which isolates the bottom cleaning chamber 7 from the light-irradiation chamber 8. The bottom light-transparent window 6 may comprise a glass plate allowing transmission of a short wavelength ultraviolet ray. The glass plate may preferable comprise a soda-lime glass plate or a quartz glass plate. An ultraviolet ray lamp 1 is provided at a center position of the light-irradiation chamber 8. The ultraviolet ray lamp 1 emits a ultraviolet ray. A pair of top and bottom concave mirrors $2a$ and $2b$ are provided in light-irradiation chamber 8 and at over and under positions of the ultraviolet ray lamp 1, wherein the top and bottom concave mirrors $2a$ and $2b$ are distanced from the ultraviolet ray lump 1 in the vertical direction. The top and bottom concave mirrors $2a$ and $2b$ reflect the ultraviolet rays emitted from the ultraviolet ray lump 1. A pair of reflective mirrors 2 and 2 are provided in the light-irradiation chamber 8 and at opposite sides of the ultraviolet ray lump 1, wherein the reflective mirrors 2 and 2 are distanced from the ultraviolet ray lump 1 in the horizontal direction. The reflective mirrors 2 reflect the ultraviolet rays having been reflected by the top and bottom concave mirrors $2a$ and $2b$ toward the inner surfaces of the top and bottom dies $11a$ and $11b$. Namely, the ultraviolet rays are emitted from the ultraviolet ray lump 1 and transmitted toward the top and bottom concave mirrors $2a$ and $2b$. The ultraviolet rays are then reflected by the top and bottom concave mirrors $2a$ and $2b$ to be transmitted toward the reflective mirrors 2. The ultraviolet rays are then reflected by the reflective mirrors 2 and transmitted through the top and bottom light-transparent windows 6 to the inner surfaces of the top and bottom dies $11a$ and $11b$. A top air blower $3a$ is provided in the top cleaning chamber 7 for blowing a compressed air to the inner surface of the top die $11a$. The top air blower $3a$ has a plurality of injection ports which are directed toward the hollow portions 16 of the inner surface of the top die $11a$ so as to blow away the residual dirt on the inner surface of the top die $11a$. A bottom air blower $3b$ is provided in the bottom cleaning chamber 7 for blowing a compressed air to the inner surface of the top die $11b$. The bottom air blower $3b$ has a plurality of injection ports which are directed toward the bottom portions 16 of the inner surface of the bottom die $11b$ so as to blow away the residual dirt on the inner surface of the bottom die $11b$. The top cleaning chamber 7 has a top discharge port $10a$ from which gases in the top cleaning chamber 7 are discharged. The bottom cleaning chamber 7 has a bottom discharge port $10b$ from which gases in the bottom cleaning chamber 7 are discharged. A discharge unit 5 is further provided outside of the casing 9 of the cleaner, wherein the discharge unit 5 is connected to the top and bottom discharge ports $10a$ and $10b$ of the top and bottom cleaning chambers 7 so that the gases which may include the dirt in the top and bottom cleaning chambers 7 are discharged by the discharge unit 5 through the top and bottom discharge ports $10a$ and $10b$. The discharge unit 5 has a blower pump for discharging the gases including the dirt and a trap for storing the dirt.

Figure 3:
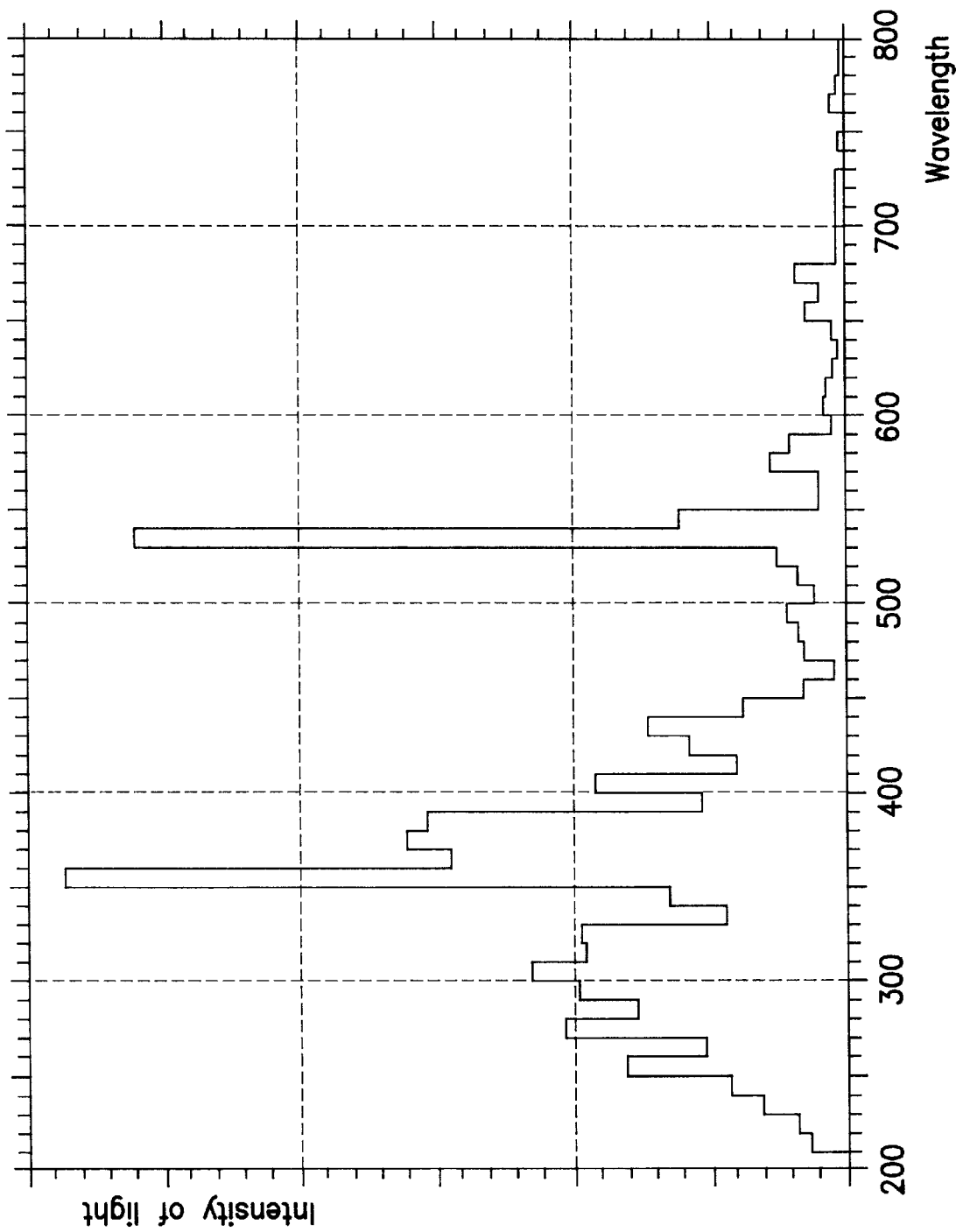
FIG. 3 is a diagram illustrative of a spectral wavelength distribution of a relationship between light intensity and wavelength for an ultra-violet ray lump used in a first embodiment in accordance with the present invention.

FIG. 3 is a diagram illustrative of a spectral wavelength distribution of a relationship between light intensity and wavelength for an ultra-violet ray lump used in a first embodiment in accordance with the present invention. The ultraviolet rays are irradiated onto the residual dirt on the surfaces of the top and bottom dies 11a and 11b so that the irradiation of the ultraviolet ray causes a dissociation of atomic bonding or molecular bonding of the organic and inorganic substances of the residual dirt adhered on the inner surfaces of the dies, provided that the ultraviolet ray has an energy which is higher than the dissociation energies of the organic and inorganic substances. Namely, the irradiation of the ultraviolet ray causes a decomposition of the organic substance of the residual dirt adhered on the inner surfaces of the top and bottom dies 11a and 11b. It is here considered that the top and bottom dies 11a and 11b are used for molding a resin such as an epoxy resin which is usually used for sealing various semiconductor devices and the residual dirt comprises the epoxy resin. The epoxy resin has a chain structure based on benzene ring and methyl group. Benzene ring and methyl group comprise C=C, C—C, C—H, and C—O bondings. These C=C, C—C, C—H, and C—O bondings have bonding energies which are not higher than 145 kcal. If, for example, the organic substances of the residual dirt having the C—C and C—H bondings receives irradiation of the ultraviolet ray, then C—C and C—H bondings are broken or dissociated to generate —H or hydrogen atoms having dangling bond and —C or carbon atoms having dangling bond so that the hydrogen atoms —H having dangling bond are re-bonded with each other to form $H_2$. These C—C and C—H bondings are broken or dissociated by energies of 95 kcal and 85 kcal respectively which correspond to wavelengths of 254 nanometers and 300 nanometers. Therefore, the irradiation of the ultraviolet rays having the wavelength of 254 nanometers and 300 nanometers onto the organic substance of the residual dirt having the C—C and C—H bondings causes the dissociation of the C—C and C—H bondings. In those manners, the organic substances of the residual dirt are decomposed by dissociation reactions of the atomic bondings constituting the substances. The decomposed organic substances are easily removed by blowing the compressed airs from the inner surfaces of the top and bottom dies 11a and 11b. Further, the irradiation of the ultraviolet ray onto the organic and inorganic substances of the residual dirt does heat up the organic and inorganic substances of the residual dirt whereby the decompositions of the organic and inorganic substances are promoted by the heating. If, for example, the ray may include long wavelength components of 365 nanometers and 540 nanometers, then thermal decompositions of the organic and inorganic substances may be caused. As illustrated in FIG. 3, the ultraviolet rays have wavelengths of not shorter than 200 nm to avoid generation of ozone. If the ray includes a shorter wavelength composition than 200 nanometers, then it may be possible to provide a cut-off filter for cutting off the shorter wavelength composition than 200 nanometers of the ultraviolet ray.

After the top and bottom dies 11a and 11b have been opened, the cleaner is inserted into between the top and bottom dies 11a and 11b. If there is any gap between the top and bottom cleaning chambers 7 of the cleaner and the inner surfaces of the top and bottom dies 11a and 11b, then it is required to seal the gap with a sealing material such as rubber seal of clay type. Thereafter, the ultraviolet ray lamp 1 lights ON to irradiate the ultraviolet rays onto the inner surfaces of the top and bottom dies 11a and 11b whereby the organic substances as the residual dirt adhered on the inner surfaces of the top and bottom dies 11a and 11b are decomposed through the dissociation reaction by the irradiation of the ultraviolet ray. A dried and compressed air or a dried and compressed inert gas such as nitrogen gas is blown from the top and bottom blowers 3a and 3b onto the decomposed residual dirt on the inner surfaces of the top and bottom dies 11a and 11b so that not only the decomposed organic substance but also the inorganic substance are also blown away by the blowing compressed gas. The top and bottom dies 11a and 11b are heated up by the irradiation of the ultraviolet ray but cooled down by blowing the compressed gas. Since the blowing gas has been dried, then the dirt once blown by the blowing the dried and compressed gas are in dry state. The dirt blown from the inner surfaces of the top and bottom dies 11a and 11b is unlikely to be adhered onto the inner surfaces of the top and bottom dies 11a and 11b, but is likely to be discharged through the top and bottom discharge ports 10a and 10b into the discharge unit 5.

The above novel cleaner is capable of removing the organic and inorganic residual substances from inner surfaces of the dies in a short time without operations under high temperature and severe conditions.

The above novel cleaner is also capable of removing the organic and inorganic residual substances from inner surfaces of the dies without dispersion of harmful substances such as ozone.

The above novel cleaner is also capable of removing the organic and inorganic residual substances from inner surfaces of the dies without shortening a life-time of the dies.

Second Embodiment

Figure 4:
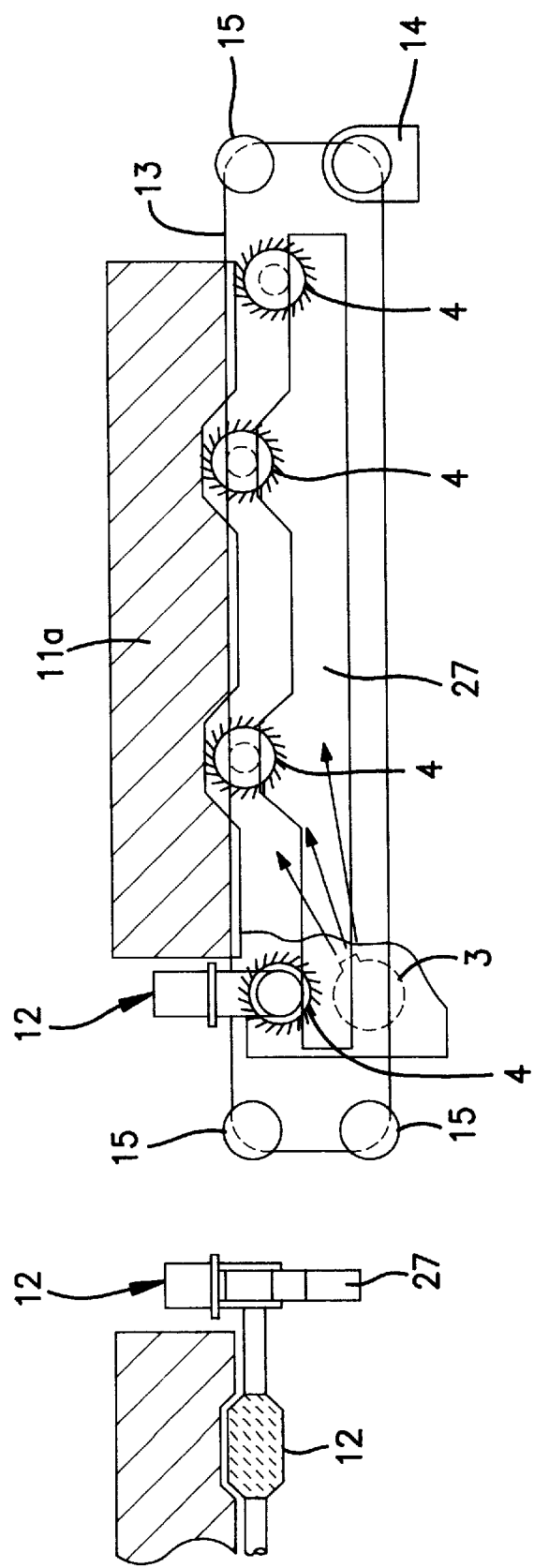
FIG. 4 is a schematic view illustrative of a top roller brush mechanism provided in a novel cleaner in a second embodiment in accordance with the present invention.

A second embodiment according to the present invention will be described in detail, wherein there is provided a novel cleaner for removing a residual dirt including at least any one of organic and inorganic substances from inner surfaces of dies which is used for resin-molding. A structural difference of the novel cleaner of this second embodiment from the first embodiment is in further providing top and bottom roller brush mechanisms, one of which is illustrated in FIG. 4. Each of the top and bottom roller brush mechanisms has a roller brush 4 and is capable of moving the roller brush 4 along the surface of the inner surface of the die. Each of the top and bottom roller brush mechanisms also has a traveling head 12 accommodating a motor for causing a high speed rotation of the roller brush 4. The traveling head 12 is pulled by a traction motor 14 through a tension rope 13. The tension rope 13 is tensioned by tension rollers 15 and pulled by the traction motor 14. The top and bottom roller brush mechanisms are accommodated in top and bottom cleaning chambers bounded with the top and bottom dies 11a and 11b. The traction motor 14 is reversible and thus shows bi-directional rotations. Further, the top and bottom roller brush mechanisms have top and bottom guide plates 27 for guiding the travelings of the top and bottom roller brushes 4 so as to define the positional level of the roller brush 4 so that the roller brush 4 reach or securely contact with the inner surface of the die having the plural hollow portions. The brush of the roller brush 4 is preferable soft for avoiding any flaw to be given to the inner surface of the die. The other structure of the cleaner of this second embodiment is the same as in the first embodiment as illustrated in FIGS. 2A and 2B.

Namely, the novel cleaner is positioned in use between top and bottom dies 11a and 11b which are distanced in a vertical direction from each other. Each of the top and bottom dies 11a and 11b has an inner surface having plural hollow portions 16. The cleaner comprises a casing 9 which has top and bottom walls which further have top and bottom openings 9a and 9b, wherein the top and bottom openings 9a and 9b are adjacent to inner surfaces of the top and bottom dies 11a and 11b. The top and bottom openings 9a and 9b are tightly in contact with the surfaces of the top and bottom dies 11a and 11b so that the casing 9 of the cleaner and the inner surfaces of the dies 11a and 11b do form an air-tightly closing inner space. The casing 9 comprises a light-irradiation chamber 8 and top and bottom cleaning chambers 7 provided on the top and bottom of the light-irradiation chamber 8. A top surface of the top cleaning chamber 7 has the top opening 9a bounded with the inner surface of the top die 9a. A bottom surface of the top cleaning chamber 7 has a top light-transparent window 6 which isolates the top cleaning chamber 7 from the light-irradiation chamber 8. The top light-transparent window 6 may comprise a glass plate allowing transmission of a short wavelength ultraviolet ray. The glass plate may preferable comprise a soda-lime glass plate or a quartz glass plate. A bottom surface of the bottom cleaning chamber 7 has the bottom opening 9b bounded with the inner surface of the bottom die 9b. A top surface of the bottom cleaning chamber 7 has a bottom light-transparent window 6 which isolates the bottom cleaning chamber 7 from the light-irradiation chamber 8. The bottom light-transparent window 6 may comprise a glass plate allowing transmission of a short wavelength ultraviolet ray. The glass plate may preferable comprise a soda-lime glass plate or a quartz glass plate. An ultraviolet ray lamp 1 is provided at a center portion of the light-irradiation chamber 8. The ultraviolet ray lamp 1 emits a ultraviolet ray. A pair of top and bottom concave mirrors 2a and 2b are provided in the light-irradiation chamber 8 and at over and under positions of the ultraviolet ray lamp 1, wherein the top and bottom concave mirrors 2a and 2b are distanced from the ultraviolet ray lamp 1 in the vertical direction. The top and bottom concave mirrors 2a and 2b reflect the ultraviolet rays emitted from the ultraviolet ray lamp 1. A pair of reflective mirrors 2 and 2 are provided in the light-irradiation chamber 8 and at opposite sides of the ultraviolet ray lamp 1, wherein the reflective mirrors 2 and 2 are distanced from the ultraviolet ray lamp 1 in the horizontal direction. The reflective mirrors 2 reflect the ultraviolet rays having been reflected by the top and bottom concave mirrors 2a and 2b toward the inner surfaces of the top and bottom dies 11a and 11b. Namely, the ultraviolet rays are emitted from the ultraviolet ray lamp 2 and transmitted toward the top and bottom concave mirrors 2a and 2b. The ultraviolet rays are then reflected by the top and bottom concave mirrors 2a and 2b to be transmitted toward the reflective mirrors 2. The ultraviolet rays are then reflected by the reflective mirrors 2 and transmitted through the top and bottom light-transparent windows 6 to the inner surfaces of the top and bottom dies 11a and 11b. A top air blower 3a is provided in the top cleaning chamber 7 for blowing a compressed air to the inner surface of the top die 11a. The top air blower 3a has a plurality of injection ports which are directed toward the hollow portions 16 of the inner surface of the top die 11a so as to blow away the residual dirt on the inner surface of the top die 11a. A bottom air blower 3b is provided in the bottom cleaning chamber 7 for blowing a compressed air to the inner surface of the top doe 11b. The bottom air blower 3b has a plurality of injection ports which are directed toward the hollow portions 16 of the inner surface of the bottom die 11b so as to blow away the residual dirt on the inner surface of the of the bottom die 11b. The top cleaning chamber 7 has a top discharge port 10a from which gases in the top cleaning chamber 7 are discharged. The bottom cleaning chamber 7 has a bottom discharge port 10b from which gases in the bottom cleaning chamber 7 are discharged. A discharge unit 5 is further provided outside of the casing 9 of the cleaner, wherein the discharge unit 5 is connected to the top and bottom discharge ports 10a and 10b of the top and bottom cleaning chambers 7 so that the gases which may include the dirt in the top and bottom cleaning chamber 7 are discharged by the discharge unit 5 through the top and bottom discharge ports 10a and 10b. The discharge unit 5 has a blower pump for discharging the gases including the dirt and a trap for storing the dirt.

FIG. 3 is a diagram illustrative of a spectral wavelength distribution of a relationship between light intensity and wavelength for an ultra-violet ray lump used in a first embodiment in accordance with the present invention. The ultraviolet rays are irradiated onto the residual dirt on the surfaces of the top and bottom dies 11a and 11b so that the irradiation of the ultraviolet ray causes a dissociation of atomic bonding or molecular bonding of the organic substances of the residual dirt adhered on the inner surfaces of the dies, provided that the ultraviolet ray has an energy which is higher than the dissociation energies of the organic substances. Namely, the irradiation of the ultraviolet ray causes a decomposition of the organic substance of the residual dirt adhered on the inner surfaces of the top and bottom dies 11a and 11b. It is here considered that the top and bottom dies 11a and 11b are used for molding a resin such as an epoxy resin which is usually used for sealing various semiconductor devices and the residual dirt comprises the epoxy resin. The epoxy resin has a chain structure based on benzene ring and methyl group. Benzene ring and methyl group comprise C=C, C—C, C—H, and C—O bondings. These C=C, C—C, C—H, and C—O bondings have bonding energies which are not higher than 145 kcal. If, for example, the organic substance of the residual dirt having the C—C and C—H bondings receives irradiation of the ultraviolet ray, then C—C and C—H bondings are broken or dissociated to generate —H or hydrogen atoms having dangling bond and —C or carbon atoms having dangling bond so that the hydrogen atoms —H having dangling bond are re-bonded with each other to form $H_2$. These C—C and C—H bondings are broken or dissociated by energies of 95 kcal and 85 kcal respectively which correspond to wavelengths of 254 nanometers and 300 nanometers. Therefore, the irradiation of the ultraviolet rays having the wavelengths of 254 nanometers and 300 nanometers onto the organic substance of the residual dirt having the C—C and C—H bondings causes the dissociation of the C—C and C—H bondings. In those manners, the organic substances of the residual dirt are decomposed by dissociation reactions of the atomic bondings constituting the substances. The decomposed organic substances are easily removed by blowing the compressed airs from the inner surfaces of the top and bottom dies 11a and 11b. Further, the irradiation of the ultraviolet ray onto the organic and inorganic substances of the residual dirt does heat up the organic and inorganic substances of the residual dirt whereby the decompositions of the organic and inorganic substances are promoted by the heating. If, for example, the ray may include long wavelength components of 365 nanometers and 540 nanometers, then thermal decompositions of the organic and inorganic substances may be caused. As illustrated in FIG. 3, the ultraviolet rays have wavelengths of not shorter than 200 nm to avoid generation of ozone. If the ray includes a shorter wavelength composition than 200 nanometers, then it may be possible to provide a cut-off filter for cutting off the shorter wavelength composition than 200 nanometers of the ultraviolet ray.

After the top and bottom dies 11a and 11b have been opened, the cleaner is inserted into between the top and bottom dies 11a and 11b. If there is any gap between the top and bottom cleaning chambers 7 of the cleaner and the inner surfaces of the top and bottom dies 11a and 11b, then it is required to seal the gap with a sealing material such as rubber seal of clay type. Thereafter, the ultraviolet ray lamp 1 lights ON to irradiate the ultraviolet rays onto the inner surfaces of the top and bottom dies 11a and 11b whereby the organic substances as the residual dirt adhered on the inner surfaces of the top and bottom dies 11a and 11b are decomposed through the dissociation reaction by the irradiation of the ultraviolet ray. A dried and compressed air or a dried and compressed inert gas such as nitrogen gas is blown from the top and bottom blowers 3a and 3b onto the decomposed residual dirt on the inner surfaces of the top and bottom dies 11a and 11b so that not only the decomposed organic substance but also the inorganic substance are also blown away by the blowing compressed gas. The top and bottom dies 11a and 11b are heated up by the irradiation of the ultraviolet ray but cooled down by blowing the compressed gas. Since the blowing gas has been dried, then the dirt once blown by blowing the dried and compressed gas are in dry state. The dirt blown from the inner surfaces of the top and bottom dies 11a and 11b is unlikely to be adhered onto the inner surfaces of the top and bottom dies 11a and 11b, but is likely to be discharged through the top and bottom discharge ports 10a and 10b into the discharge unit 5.

Further, the roller brush 4 of each of the top and bottom roller brush mechanisms is rotated at a high rotation speed, for example, in the rang of 500–3000 rpm. The traction motor 15 is rotated in front direction so that the traveling head 12 moves from the left side to the right side in FIG. 4, whereby the roller brush 4 on the high speed rotation brushes the inner surface of each of the top and bottom dies 11a and 11b. The guide plate 27 guides the roller brush 4 along the difference in level of the inner surface of the die so that the roller brush 4 varies in level to flow the variation in level of the inner surface of the die. If, for example, the top roller brush 4 comes positioned under the hollow portion of the inner surface of the top die 11a, then the top roller brush 4 is risen in positional level or comes close to the top side by the top guide plate 27. If the traveling head 12 arrives the right end position, then the traction motor is switched to rotate in reverse direction so that the traveling head 12 moves from the right side to the left side.

The above novel cleaner is capable of removing the organic and inorganic residual substances from inner surfaces of the dies in a short time without operations under high temperature and severe conditions.

The above novel cleaner is also capable of removing the organic and inorganic residual substances from inner surfaces of the dies without dispersion of harmful substances such as ozone.

The above novel cleaner is also capable of removing the organic and inorganic residual substances from inner surfaces of the dies without shortening a life-time of the dies.

FIG. 5 is a diagram illustrative of cleaning effects of the conventional and novel cleaning methods over time, wherein mark ● represents the level 1, wherein the cleaning is carried out by combinations of the ultraviolet ray irradiation, the compressed air blowing, and brushing, mark ○ represents the level 2, wherein the cleaning is carried out by the ultraviolet ray irradiation only, mark □ represents the level 3, wherein the cleaning is carried out by combinations of the ultraviolet ray irradiation and the compressed air blowing, and marks Δ represents the level 4, wherein the cleaning is carried out in the conventional method by use of cleaning resin. The most effective method is the level 1 using the combinations of the ultraviolet ray irradiation, the compressed air blowing, and brushing. The second effective method is the level 3 using the combinations of the ultraviolet ray irradiation and the compressed air blowing. The third effective method is the level 2 using the ultraviolet ray irradiation only. Those novel methods are much more effective than the conventional method of the level 4.

Third Embodiment

Figure 6A:
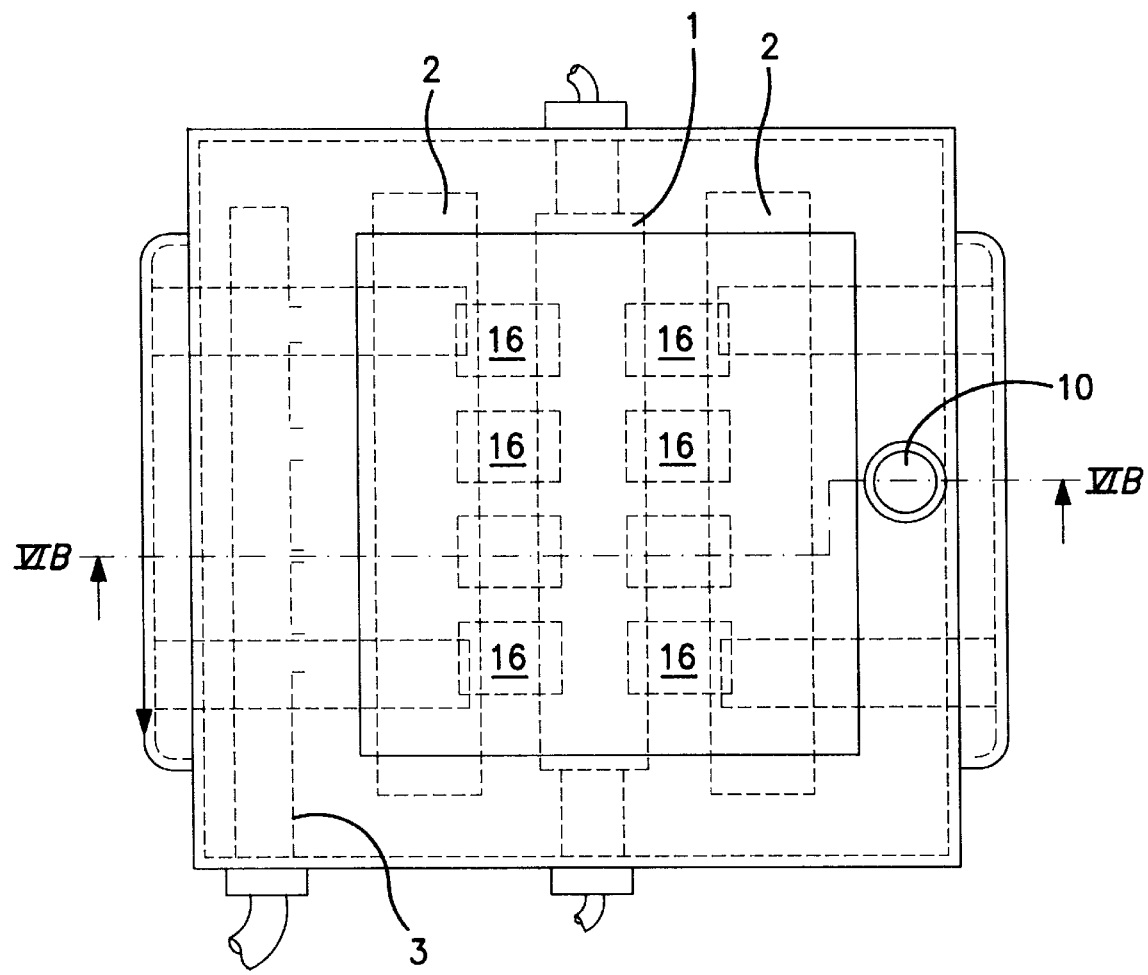
FIG. 6A is a plane view illustrative of a novel cleaner for removing a residual dirt including at least any one of organic and inorganic substances from inner surfaces of dies in a third embodiment in accordance with the present invention.
Figure 6B:
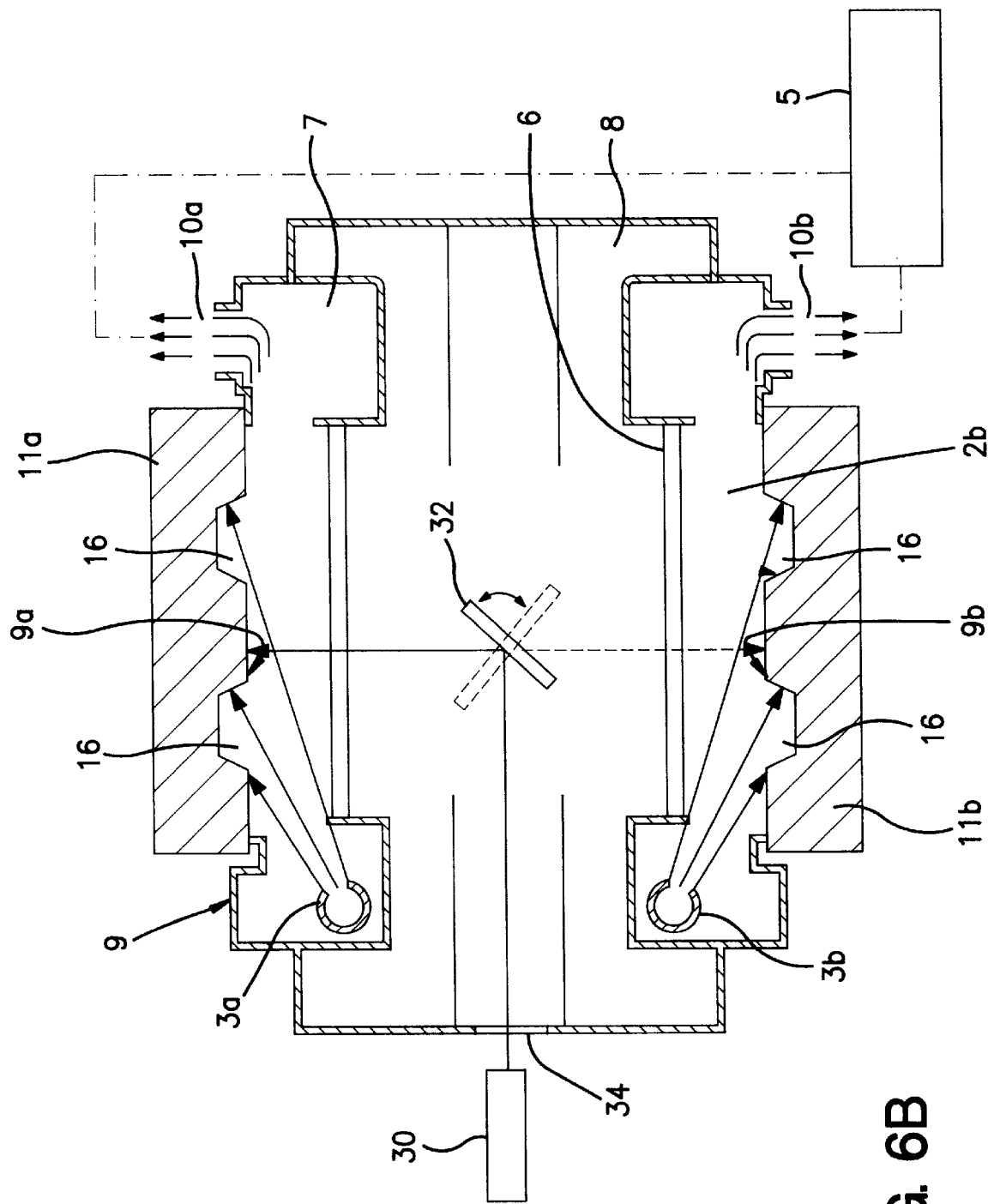
FIG. 6B is a cross sectional elevation view illustrative of a novel cleaner for removing a residual dirt including at least any one of organic and inorganic substances from inner surfaces of dies taken along an VIB—VIB line of FIG. 6A.

A third embodiment according to the present invention will be described in detail with reference to FIGS. 6A and 6B, wherein there is provided a novel cleaner for removing a residual dirt including at least any one or organic and inorganic substances from inner surfaces of dies which is used for resin-molding. FIG. 6A is a plane view illustrative of a novel cleaner for removing a residual dirt including at least any one of organic and inorganic substances from inner surfaces of dies. FIG. 6B is a cross sectional elevation view illustrative of a novel cleaner for removing a residual dirt including at least any one of organic and inorganic substances from inner surfaces of dies taken along an VIB—VIB line of FIG. 6A. A structural difference of the novel cleaner of this third embodiment from the first embodiment is in use of a laser beam irradiation in place of the ultraviolet ray irradiation. The novel cleaner is positioned in use between top and bottom dies 11a and 11b which are distanced in a vertical direction from each other. Each of the top and bottom dies 11a and 11b has an inner surface having plural hollow portions 16. The cleaner comprises a casing 9 which has top and bottom walls which further have top and bottom openings 9a and 9b, wherein the top and bottom openings 9a and 9b are adjacent to inner surfaces of the top and bottom dies 11a and 11b. The top and bottom openings 9a and 9b are tightly in contact with the surfaces of the top and bottom dies 11a and 11b so that the casing 9 of the cleaner and the inner surfaces of the dies 11a and 11b do form an air-tightly closing inner space. The casing 9 comprises a light-irradiation chamber 8 and top and bottom cleaning chambers 7 provided on the top and bottom of the light-irradiation chamber 8. A top surface of the top cleaning chamber 7 has the top opening 9a bounded with the inner surface of the top die 9a. A bottom surface of the top cleaning chamber 7 has a top light-transparent window 6 which isolates the top cleaning chamber 7 from the light-irradiation chamber 8. The top light-transparent window 6 may comprise a glass plate allowing transmission of a laser beam. The glass plate may preferable comprise a soda-lime glass plate or a quartz glass plate. A bottom surface of the bottom cleaning chamber 7 has the bottom opening 9b bounded with the inner surface of the bottom die 9b. A top surface of the bottom cleaning chamber 7 has a bottom light-transparent window 6 which isolates the bottom cleaning chamber 7 from the light-irradiation chamber 8. The bottom light-transparent window 6 may comprise a glass plate allowing transmission of a laser beam. The glass plate may preferably comprise a soda-lime glass plate or a quartz glass plate. A laser device 30 for emitting a laser beam may be provided outside of the casing 9 of the cleaner so that the laser device 30 has he same level as a center of the casing 9 of the cleaner. The casing 9 of the cleaner has a window 34 on a side wall facing to the laser device 30 so that the laser beam emitted from the laser device 30 is transmitted through the window 34 into the light-irradiation chamber 8. A reflective mirror 32 is also provided in the light-irradiation chamber 8 of the casing 9 of the cleaner. The reflective mirror 32 is kept at the same level as the center of the casing 9 of the cleaner so that the laser beam emitted from the laser device 30 reaches the reflective mirror and then reflected thereby. The reflective mirror 32 is capable of varying mirror face so that the laser beam reflected thereby is transmitted toward the inner surface of the top or bottom dies. Further, a reflective mirror moving mechanism not illustrated is provided for moving the reflective mirror 32 so that the laser beam can be scanned on entries of the inner surface of the top or bottom die. Instead of the provision of the reflective mirror moving mechanism, it is also available that the reflective mirror 32 changes in mirror face direction to scan the laser beam irradiation onto the entries of the inner surface of the top or bottom die. Further, the laser device 30 may be provided within the light-irradiation chamber 8 of the casing 9 of the cleaner so that the laser device 30 has the same level as the center of the casing 9. In this case, no window is provided on the side wall of the casing. A top air blower 3a is provided in the top cleaning chamber 7 for blowing a compressed air to the inner surface of the top die 11a. The top air blower 3a has a plurality of injection ports which are directed toward the hollow portions 16 of the inner surface of the top die 11a so as to blow away the residual dirt on the inner surface of the top die 11a. A bottom air blower 3b is provided in the bottom cleaning chamber 7 for blowing a compressed air to the inner surface of the top die 11b. The bottom air blower 3b has a plurality of injection ports which are directed toward the hollow portions 16 of the inner surface of the bottom die 11b so as to blow away the residual dirt on the inner surface of the bottom die 11b. The top cleaning chamber 7 has a top discharge port 10a from which gases in the top cleaning chamber 7 are discharged. The bottom cleaning chamber 7 has a bottom discharge port 10b from which gases in the bottom cleaning chamber 7 are discharged. A discharge unit 5 is further provided outside of the casing 9 of the cleaner, wherein the discharge unit 5 is connected to the top and bottom discharge ports 10a and 10b of the top and bottom cleaning chambers 7 so that the gases which may include the dirt in the top and bottom cleaning chambers 7 are discharged by the discharge unit 5 through the top and bottom discharge ports 10a and 10b. The discharge unit 5 has a blower pump for discharging the gases including the dirt and a trap for storing the dirt.

The laser beam is irradiated onto the residual dirt on the surfaces of the top and bottom dies 11a and 11b so that the irradiation of the laser beam causes a dissociation of atomic bonding or molecular bonding of the organic substances of the residual dirt adhered on the inner surfaces of the dies, provided that the laser beam has an energy which is higher than the dissociation energies of the organic substances. Namely, the irradiation of the laser beam causes a decomposition of the organic substances of the residual dirt adhered on the inner surfaces of the top and bottom dies 11a and 11b. It is here considered that the top and bottom dies 11a and 11b are used for molding a resin such as an epoxy resin which is usually used for sealing various semiconductor devices and the residual dirt comprises the epoxy resin. The epoxy resin has a chain structure based on benzene ring and methyl group. Benzene ring and methyl group comprise C=C, C—C, C—H, and C—O bondings. These C=C, C—C, C—H, and C—O bondings have bonding energies which are not higher than 145 kcal. If, for example, the organic substance of the residual dirt having the C—C and C—H bondings receives irradiation of the laser beam, then C—C and C—H bondings are broken or dissociated to generate —H or hydrogen atoms having dangling bond and —C or carbon atoms having dangling bond so that the hydrogen atoms —H having dangling bond are re-bonded with each other to form $H_2$. In those manners, the organic substances of the residual dirt are decomposed by dissociation reactions of the atomic bondings constituting the substances. The decomposed organic substances are easily removed by blowing the compressed airs from the inner surfaces of the top and bottom dies 11a and 11b. Further, the irradiation of the laser beam onto the organic substances of the residual dirt does heat up the organic and inorganic substances of the residual dirt whereby the decompositions of the organic and inorganic substances are promoted by the heating. If, for example, the laser beam may include long wavelength components, then thermal decompositions of the organic and inorganic substances may be caused.

After the top and bottom dies 11a and 11b have been opened, the cleaner is inserted into between the top and bottom dies 11a and 11b. IF there is any gap between the top and bottom cleaning chambers 7 of the cleaner and the inner surfaces of the top and bottom dies 11a and 11b, then it is required to seal the gap with a sealing material such as rubber seal of clay type. Thereafter, the laser device 30 lights ON to irradiate the laser beams onto the inner surfaces of the top and bottom dies 11a and 11b whereby the organic substances as the residual dirt adhered on the inner surfaces of the top and bottom dies 11a and 11b is decomposed through the dissociation reaction by the irradiation of the laser beam. A dried and compressed air or a dried and compressed inert gas such as nitrogen gas is blown from the top and bottom blowers 3a and 3b onto the decomposed residual dirt on the inner surfaces of the top and bottom dies 11a and 11b so that not only the decomposed organic substance but also the inorganic substance are also blown away by the blowing compressed gas. The top and bottom dies 11a and 11b are heated up by the irradiation of the laser beam but cooled down by blowing the compressed gas. Since the blowing gas has been dried, then the dirt once blown by blowing the dried and compressed gas are in dry state. The dirt blown from the inner surfaces of the top and bottom dies 11a and 11b is unlikely to be adhered onto the inner surfaces of the top and bottom dies 11a and 11b, but is likely to be discharged through the top and bottom discharge ports 10a and 10b into the discharge unit 5.

The above novel cleaner is capable of removing the organic and inorganic residual substances from inner surfaces of the dies in a short time without operations under high temperature and severe conditions.

The above novel cleaner is also capable of removing the organic and inorganic residual substances from inner surfaces of the dies without dispersion of harmful substances such as ozone.

The above novel cleaner is also capable of removing the organic and inorganic residual substances from inner surfaces of the dies without shortening a life-time of the dies.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An apparatus for removing a residual dirt including at least one of organic and inorganic substances from inner surfaces of dies, said apparatus comprising:

a casing having a light-irradiation chamber;

top and bottom cleaning chambers in ultra-violet light communication with and provided, respectively, on a top and bottom of said light-irradiation chamber;

said top and bottom cleaning chambers having, respectively, top and bottom openings adapted for tight contact with inner surfaces of, respectively, top and bottom dies to form air-tight inner spaces within said top and bottom cleaning chambers;

an ultraviolet ray lamp positioned at a center portion of said light-irradiation chamber;

a pair of concave mirrors on opposite sides of sand centered on said ultraviolet ray lamp; and a pair of convex mirrors on opposite sides of and centered on said ultraviolet ray lamp, wherein said concave and convex mirrors are arranged within said light-irradiation chamber and around said ultraviolet ray lamp so that the concave mirrors reflect light from said ultraviolet ray lamp and said convex mirrors reflect light from said concave mirrors toward the inner surfaces of the top and bottom dies.

2. The apparatus of claim 1, wherein said light-irradiation chamber is separated from each of said top and bottom cleaning chambers by a light-transparent window isolating each of said top and bottom cleaning chambers from said light-irradiation chamber.

3. The apparatus of claim 1, wherein said top and bottom cleaning chambers each comprise an gas blower having injection ports for blowing compressed gas onto the inner surfaces of the dies.

4. The apparatus of claim 3, wherein said compressed gas is nitrogen.

5. The apparatus of claim 1, wherein said an ultraviolet ray lamp provides a spectral wavelength distribution having light intensity peaks at wavelengths corresponding to dissociation energies of predetermined chemical bonds.

6. The apparatus of claim 5, wherein light intensity peaks occur at approximately 365 nanometers and 540 nanometers.

7. The apparatus of claim 2, wherein said light-transparent windows, said concave mirrors and said ultraviolet ray lamp are symmetric about a first line extending through the center of each of said light-transparent windows, said concave mirrors and said ultraviolet ray lamp.

8. The apparatus of claim 7, wherein a central point of each of said convex mirrors is on a second line drawn orthogonal to the first line.

9. The apparatus of claim 1, further comprising a top brush for brushing the inner surface of the top die and a bottom brush for brushing the inner surface of the bottom die.

10. The apparatus of claim 9, wherein said top cleaning chamber comprises a top brush guide plate shaped to match a contour of the inner surface of the top die and positioned to guide said top brush to move in directions parallel to the contour of the inner surface of the top die.

11. The apparatus of claim 10, wherein said top brush guide plate is positioned outside of a light-transparent window isolating said top cleaning chamber from said light-irradiation chamber.

12. A cleaner for use between inner surfaces of dies to remove a residual dirt including at least any one of organic and inorganic substances from the inner surfaces of the dies, said cleaner comprising:

a light-irradiation chamber;

top and bottom cleaning chambers in ultra-violet light communication with said light-irradiation chamber;

said top and bottom cleaning chambers having, respectively, top and bottom openings adapted for accepting inner surfaces of, respectively, top and bottom dies;

an ultraviolet ray lamp positioned within said light-irradiation chamber;

a pair of concave mirrors located within said light-irradiation chamber and on opposite sides of said ultraviolet ray lamp; and a pair of convex mirrors located within said light-irradiation chamber and on opposite sides of said ultraviolet ray lamp, said concave and convex mirrors being arranged so that said concave mirrors reflect light from said ultraviolet ray lamp and said convex mirrors in turn reflect light from said concave mirrors toward the inner surfaces of the top and bottom dies.

13. The cleaning device of claim 12, wherein said light-irradiation chamber is separated from each of said top and bottom cleaning chambers by a light-transparent window.

14. The cleaning device of claim 12, wherein said top and bottom cleaning chambers each comprise an air blower having injection ports for blowing air onto the inner surfaces of the dies.

15. The cleaning device of claim 14, wherein said air is compressed air.

16. The cleaning device of claim 12, wherein said an ultraviolet ray lamp provides a spectral wavelength distribution with light intensity peaks at wavelengths corresponding to dissociation energies of predetermined chemical bonds.

17. The cleaning device of claim 16, wherein the light intensity peaks occur at approximately 365 nanometers and 540 nanometers.

18. The cleaning device of claim 13, wherein an entire rear surface of each of said concave mirrors face a corresponding one of said light-transparent windows.

19. The cleaning device of claim 18, wherein a center-most point of each of said convex mirrors is on a line drawn through a center of said ultraviolet ray lamp and parallel to said light-transparent windows.

20. The cleaning device of claim 12, further comprising a top brush for brushing the inner surface of the top die and a bottom brush for brushing the inner surface of the bottom die.

21. The cleaning device of claim 20, wherein said bottom cleaning chamber comprises a bottom brush guide plate shaped to match a contour of the inner surface of the bottom die and positioned to guide said bottom brush to move in directions parallel to the contour of the inner surface of the bottom die.

22. The apparatus of claim 21, wherein said top brush guide plate is positioned outside of a light-transparent window isolating said top cleaning chamber from said light-irradiation chamber.

* * * * *